United States Patent
Choi et al.

(10) Patent No.: US 9,558,979 B2
(45) Date of Patent: Jan. 31, 2017

(54) METHOD FOR MANUFACTURING SEMICONDUCTOR DEVICE

(71) Applicant: SAMSUNG ELECTRONICS CO., LTD., Suwon-si, Gyeonggi-do (KR)

(72) Inventors: Hwa Seob Choi, Incheon (KR); Yu Sung Jang, Yongin-si (KR); Tai Young Eum, Suwon-si (KR); Jee Ho Lee, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 559 days.

(21) Appl. No.: 14/046,469

(22) Filed: Oct. 4, 2013

(65) Prior Publication Data

US 2014/0319784 A1 Oct. 30, 2014

(30) Foreign Application Priority Data

Apr. 29, 2013 (KR) ........................ 10-2013-0047577

(51) Int. Cl.
*B23B 31/02* (2006.01)
*B23B 5/34* (2006.01)
(Continued)

(52) U.S. Cl.
CPC ......... *H01L 21/681* (2013.01); *H01L 21/6835* (2013.01); *H01L 21/6836* (2013.01);
(Continued)

(58) Field of Classification Search
CPC ............. H01L 21/67092; H01L 21/681; H01L 21/6835; H01L 21/6836; H01L 2221/68327; H01L 2221/6834; Y10T 279/11; Y10T 279/21
(Continued)

(56) References Cited

U.S. PATENT DOCUMENTS 6,620,028 B2    9/2003  Yang et al.
6,806,544 B2   10/2004  Liu
(Continued)

FOREIGN PATENT DOCUMENTS

CN    1463032    12/2003
CN    1508850     6/2004
(Continued)

OTHER PUBLICATIONS

Chinese Office Action dated May 23, 2016.

*Primary Examiner* — Mohammad Ali
*Assistant Examiner* — Yuhui R Pan
(74) *Attorney, Agent, or Firm* — F. Chau & Associates, LLC

(57) ABSTRACT

A wafer chuck holds a wafer on a surface thereof such that an image of the wafer can be formed from light reflected by the surface of the wafer chuck. The surface of the wafer chuck is a planar surface that has a reflectivity equal to or greater than 40%, and/or a whiteness index value equal to or greater than 90. The wafer chuck can include a ceramic containing aluminum oxide having a purity equal to or greater than 95%. The planar surface of the wafer chuck is such that light illuminating the surface of the wafer chuck is reflected by the surface of the wafer chuck through the wafer. The wafer chuck can be used with an apparatus for cutting the wafer, and the light reflected by the surface can be used to form an image of the wafer used identifying cutting lines on the wafer.

20 Claims, 15 Drawing Sheets

(51) Int. Cl.
  *H01L 21/68* (2006.01)
  *H01L 21/683* (2006.01)
  *H01L 21/67* (2006.01)
(52) U.S. Cl.
  CPC  *H01L 21/67092* (2013.01); *H01L 2221/6834* (2013.01); *H01L 2221/68327* (2013.01); *Y10T 279/11* (2015.01); *Y10T 279/21* (2015.01)
(58) Field of Classification Search
  USPC .................................................. 279/3, 126
  See application file for complete search history.

(56) References Cited

U.S. PATENT DOCUMENTS

| | | | |
|---|---|---|---|
| 6,869,819 B2 | 3/2005 | Watanabe et al. | |
| 6,960,813 B2 | 11/2005 | Liu | |
| 7,654,887 B2 | 2/2010 | Ishikawa et al. | |
| 2002/0109520 A1* | 8/2002 | Heald | H01S 5/0201 324/750.19 |
| 2005/0128674 A1 | 6/2005 | Ohashi et al. | |
| 2009/0002913 A1* | 1/2009 | Naim | H01L 21/67109 361/234 |
| 2009/0314144 A1* | 12/2009 | Iri | B28D 5/0064 83/13 |
| 2011/0253314 A1* | 10/2011 | George | B32B 43/006 156/706 |
| 2012/0193878 A1 | 8/2012 | Suzuki et al. | |
| 2012/0264868 A1* | 10/2012 | Lu | C08L 27/18 524/430 |
| 2012/0289026 A1* | 11/2012 | Ueno | B23K 26/38 438/462 |

FOREIGN PATENT DOCUMENTS

| | | |
|---|---|---|
| JP | 10-229115 A | 8/1998 |
| JP | 2001-308075 A | 11/2001 |
| JP | 2002-203893 | 7/2002 |
| JP | 4103385 A | 6/2008 |
| JP | 4761334 B2 | 8/2011 |
| JP | 2012-069557 A | 4/2012 |
| KR | 10-0411617 A | 12/2003 |
| KR | 10-2006-0121561 A | 11/2006 |

* cited by examiner

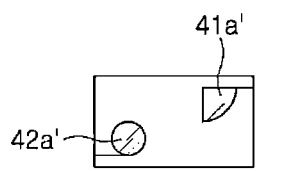 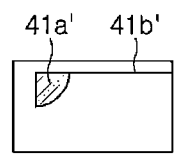 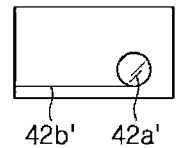
FIG. 9A   FIG. 9B   FIG. 9C
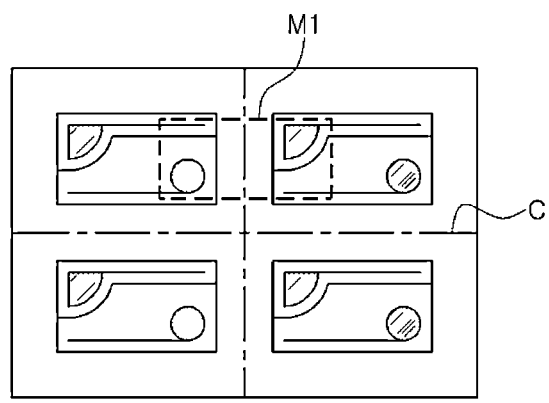
FIG. 10

METHOD FOR MANUFACTURING SEMICONDUCTOR DEVICE

CROSS-REFERENCE TO RELATED APPLICATIONS

This application claims the priority of Korean Patent Application No. 2013-0047577 filed on Apr. 29, 2013, in the Korean Intellectual Property Office, the disclosure of which is incorporated herein by reference.

TECHNICAL FIELD

The present disclosure relates to a method for manufacturing a semiconductor device.

BACKGROUND

In general, a semiconductor device is one of a plurality of individual device units formed on a single semiconductor device wafer. The wafer is subsequently separated and cut into respective individual device units through a method such as dicing, laser scribing, or the like, so as to form a plurality of individual device units. In cutting the semiconductor device wafer, the location of cutting lines should be properly determined. Indeed, if the cutting lines on the semiconductor device wafer are erroneously determined, some or all of the plurality of semiconductor devices may be miscut and damaged, and may therefore need to be discarded. Therefore, a method for reducing errors in determining cutting lines on the semiconductor device wafer is required.

SUMMARY

Various aspects of the present subject matter provide an apparatus for cutting a wafer, a wafer chuck configured to hold a wafer, a method of cutting a wafer having a plurality of semiconductor devices disposed thereon, and a method for manufacturing a semiconductor device, in which a surface of a wafer chuck has high reflectivity, high whiteness, and/or high aluminum oxide purity.

However, objects of the present subject matter are not limited thereto and may include objects and effects that may be recognized from technical solutions or embodiments described hereinafter although not explicitly mentioned.

According to an aspect of the present subject matter, an apparatus for cutting a wafer includes: a wafer chuck configured to hold the wafer on a surface thereof, wherein the surface of the wafer chuck on which the wafer is held has a reflectivity equal to or greater than 40%; a light source configured to illuminate the surface of the wafer chuck; an image capture device configured to form an image of the wafer based on light emitted by the light source and reflected by the surface of the wafer chuck; a processor configured to determine locations of cutting lines on the wafer based on the formed image; and a cutting assembly configured to cut the wafer along the cutting lines determined by the processor.

The surface of the wafer chuck on which the wafer is held can have a whiteness index value equal to or greater than 90.

The wafer chuck can be made of a ceramic containing aluminum oxide having a purity equal to or greater than 95%.

The wafer can be a transparent wafer.

The wafer chuck can be a porous ceramic, and the wafer can be held to the surface of the porous wafer chuck using vacuum adsorption through pores of the ceramic wafer chuck.

The apparatus can further include an adhesive layer disposed on the surface of the wafer chuck to hold the wafer on the surface of the wafer chuck and formed of a transparent material.

Electrode patterns of a plurality of semiconductor devices disposed on a surface of the wafer may impede passage of the reflected light through the wafer, and the image capture device may form the image of the wafer showing first regions of the wafer in which light emitted by the light source is reflected by the surface of the wafer chuck to the image capture device, and second regions of the wafer having electrode patterns therein in which light emitted by the light source is not reflected by the surface of the wafer chuck to the image capture device.

The processor may determine locations of cutting lines on the wafer by performing steps of: identifying at least one location in the formed image matching a pre-set image of an electrode pattern of a plurality of electrode patterns disposed on the wafer; and determining locations of the cutting lines on the wafer based on the identified at least one location and on a location of a cutting line in the matched pre-set image of the electrode pattern.

The processor may be configured to determine locations of a first set of cutting lines on the wafer based on the formed image prior to cutting of the wafer by the cutting assembly, and may further be configured to determine locations of a second set of cutting lines on the wafer based on another formed image of the wafer following the cutting of the wafer along the first set of cutting lines.

According to another aspect of the inventive subject matter, an apparatus for cutting a wafer includes: a wafer chuck configured to hold the wafer on a surface thereof, wherein the surface of the wafer chuck on which the wafer is held has a whiteness index value equal to or greater than 90; a light source configured to illuminate the surface of the wafer chuck; an image capture device configured to form an image of the wafer based on light emitted by the light source and reflected by the surface of the wafer chuck; a processor configured to determine locations of cutting lines on the wafer based on the formed image; and a cutting assembly configured to cut the wafer along the cutting lines determined by the processor.

The wafer chuck may be made of a ceramic containing aluminum oxide having a purity equal to or greater than 95%.

The surface of the wafer chuck on which the wafer is held may have a reflectivity equal to or greater than 40%.

Electrode patterns of a plurality of semiconductor devices disposed on a surface of the wafer may impede passage of the reflected light through the wafer, and the image capture device may form the image of the wafer showing first regions of the wafer in which light emitted by the light source is reflected by the surface of the wafer chuck to the image capture device, and second regions of the wafer having electrode patterns therein in which light emitted by the light source is not reflected by the surface of the wafer chuck to the image capture device.

The processor may determine locations of cutting lines on the wafer by performing steps of: identifying at least one location in the formed image matching a pre-set image of an electrode pattern of a plurality of electrode patterns disposed on the wafer; and determining locations of the cutting lines on the wafer based on the identified at least one location and on a location of a cutting line in the matched pre-set image of the electrode pattern.

The processor may be configured to determine locations of a first set of cutting lines on the wafer based on the formed image prior to cutting of the wafer by the cutting assembly, and may be further configured to determine locations of a second set of cutting lines on the wafer based on another formed image of the wafer following the cutting of the wafer along the first set of cutting lines.

According to another aspect of the present subject matter, an apparatus for cutting a wafer includes: a wafer chuck configured to hold the wafer on a surface thereof, wherein the wafer chuck is made of a ceramic containing aluminum oxide having a purity equal to or greater than 95%; a light source configured to illuminate the surface of the wafer chuck; an image capture device configured to form an image of the wafer based on light emitted by the light source and reflected by the surface of the wafer chuck; a processor configured to determine locations of cutting lines on the wafer based on the formed image; and a cutting assembly configured to cut the wafer along the cutting lines determined by the processor.

The surface of the wafer chuck on which the wafer is held may have a reflectivity equal to or greater than 40%.

The surface of the wafer chuck on which the wafer is held can have a whiteness index value equal to or greater than 90.

Electrode patterns of a plurality of semiconductor devices disposed on a surface of the wafer may impede passage of the reflected light through the wafer, and the image capture device can form the image of the wafer showing first regions of the wafer in which light emitted by the light source is reflected by the surface of the wafer chuck to the image capture device, and second regions of the wafer having electrode patterns therein in which light emitted by the light source is not reflected by the surface of the wafer chuck to the image capture device.

The processor can determine locations of cutting lines on the wafer by performing steps of: identifying at least one location in the formed image matching a pre-set image of an electrode pattern of a plurality of electrode patterns disposed on the wafer; and determining locations of the cutting lines on the wafer based on the identified at least one location and on a location of a cutting line in the matched pre-set image of the electrode pattern.

The processor can be configured to determine locations of a first set of cutting lines on the wafer based on the formed image prior to cutting of the wafer by the cutting assembly, and can further be configured to determine locations of a second set of cutting lines on the wafer based on another formed image of the wafer following the cutting of the wafer along the first set of cutting lines.

According to another aspect of the present subject matter, a wafer chuck is configured to hold a wafer thereon such that an image of the wafer can be formed by an image capture device based on light reflected by the wafer chuck. The wafer chuck includes: a planar surface configured to have the wafer held thereon and having a reflectivity equal to or greater than 40%, wherein light illuminating the surface of the wafer chuck is reflected by the surface of the wafer chuck through the wafer.

The wafer chuck may be made of a ceramic containing aluminum oxide having a purity equal to or greater than 95%.

The planar surface of the wafer chuck on which the wafer is held can have a whiteness index value equal to or greater than 90.

Light illuminating the surface of the wafer chuck may be reflected by the surface of the wafer chuck only in regions of the wafer chuck that are not located below electrode patterns in the wafer.

The wafer chuck may be a porous ceramic, and the wafer may be held to the surface of the porous wafer chuck using vacuum adsorption through pores of the ceramic wafer chuck.

The wafer chuck may further include an adhesive layer disposed on the planar surface of the wafer chuck to hold the wafer on the surface of the wafer chuck and formed of a transparent material.

According to another aspect of the subject matter, a method of cutting a wafer having a plurality of semiconductor devices disposed thereon is provided. The method includes: providing a wafer chuck having a surface with a reflectivity equal to or greater than 40%; illuminating the surface of the wafer chuck having the wafer disposed thereon; obtaining an image of the wafer from light reflected on the surface of the wafer chuck through the wafer to an image capture device; identifying cutting lines on the wafer based on comparison of the obtained image of the wafer with a pre-set image; and cutting the wafer along the identified cutting lines.

The surface of the wafer chuck can be a substantially white surface having a whiteness index value equal to or greater than 90.

Electrode patterns of the plurality of semiconductor devices on the wafer can impede the passage of the reflected light therethrough, such that a difference in brightness values between one region of the obtained image of the wafer corresponding to the electrode pattern and another region of the obtained image corresponding to an area without the electrode pattern is equal to or greater than 25.

The pre-set image may be a pre-set image of an electrode pattern, and the identifying locations for the cutting lines may include identifying locations of electrode patterns in the obtained image matching the electrode pattern of the pre-set image.

The pre-set image may include electrode patterns of at least two adjacent semiconductor devices of the plurality of semiconductor devices, and the cutting line associated with the pre-set image may separate the at least two adjacent semiconductor devices.

The plurality of semiconductor devices may be disposed in rows or columns on the wafer, and the identifying may further include: identifying a first location in the obtained image matching the pre-set image and corresponding to a first semiconductor device of the plurality of semiconductor devices; identifying a second location in the obtained image of the wafer matching the pre-set image and corresponding to a second semiconductor device of the plurality of semiconductor devices located in a same row or a same column as the first semiconductor device; determining whether a line extending through the first location and the second location is aligned with a pre-set orientation line; and adjusting alignment of the wafer upon determining that the extending line is not aligned with the pre-set orientation line.

The wafer may be a transparent wafer.

According to another aspect of the present subject matter, a method of cutting a wafer having a plurality of semiconductor devices disposed thereon includes: obtaining a first image of the wafer disposed on a surface of a wafer chuck using an image capture device; identifying locations for a first group of cutting lines on the wafer based on matching a pre-set image to at least one location in the first image of the wafer; cutting the wafer along the first group of cutting lines; obtaining a second image of the wafer having been cut along the cutting lines of the first group; identifying locations for a second group of cutting lines on the wafer based on matching the pre-set image to at least one location in the second image of the wafer; and cutting the wafer along the identified second group of cutting lines.

The second group of cutting lines can include cutting lines that intersect with and are substantially perpendicular to cutting lines of the first group of cutting lines on a surface of the wafer.

The second group of cutting lines can include cutting lines that are substantially parallel to cutting lines of the first group of cutting lines on a surface of the wafer.

Cutting lines of the first group of cutting lines may be located in a first region of a surface of the wafer, and cutting lines of the second group of cutting lines may be located in a second region of the surface of the wafer that is distinct from and non-overlapping with the first region.

According to another aspect of the present subject matter, a method for manufacturing a light emitting device includes: providing a wafer chuck having a surface with a reflectivity equal to or greater than 40%; disposing a wafer having a plurality of semiconductor devices disposed thereon on the surface of the wafer chuck; identifying cutting lines on the wafer based on an image of the wafer formed from light reflected on the surface of the wafer chuck through the wafer; cutting the wafer along the identified cutting lines into a plurality of individual semiconductor devices; disposing at least one individual semiconductor device in a package body to form the light emitting device.

The providing can include providing a wafer chuck having a substantially white surface having a whiteness index value equal to or greater than 90.

The providing can include providing a wafer chuck made of a ceramic containing aluminum oxide having a purity equal to or greater than 95%.

Electrode patterns of the plurality of semiconductor devices on the wafer may impede the passage of the reflected light therethrough, such that a difference in brightness values between one region of the obtained image of the wafer corresponding to the electrode pattern and another region of the obtained image corresponding to an area without the electrode pattern is equal to or greater than 25.

The foregoing technical solutions do not fully enumerate all of the features of the present inventive concepts. The foregoing and other objects, features, aspects and advantages of the present inventive concepts will become more apparent from the following detailed description of the present inventive concepts when taken in conjunction with the accompanying drawings.

BRIEF DESCRIPTION OF THE DRAWINGS

The above and other aspects, features and other advantages of the present inventive concepts will be more clearly understood from the following detailed description taken in conjunction with the accompanying drawings, in which:

FIGS. 9A through 9C are views illustrating images of pre-set electrode patterns;

FIG. 10 is a view specifically illustrating an operation for determining regions of the wafer to be severed according to an embodiment of the present inventive concepts;

DETAILED DESCRIPTION

Figure 1:
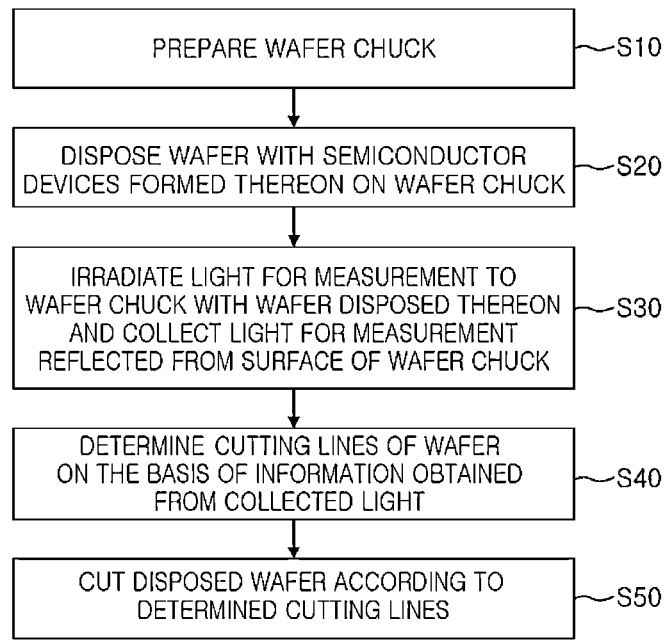
FIG. 1 is a flow chart illustrating an example of a method for manufacturing a semiconductor device according to an embodiment of the present inventive concepts.

Embodiments of the present inventive concepts will now be described in detail with reference to the accompanying drawings.

The inventive concepts may be embodied in many different forms and should not be construed as being limited to the embodiments set forth herein. Rather, these embodiments are provided so that this disclosure will be thorough and complete, and will fully convey the scope of the inventive concepts to those skilled in the art. In the drawings, the shapes and dimensions of elements may be exaggerated for clarity, and the same reference numerals will be used throughout to designate the same or like components.

FIG. 1 is a flow chart illustrating an example of a method for manufacturing a semiconductor device according to an embodiment of the present inventive concepts.

Referring to FIG. 1, a method for manufacturing a semiconductor device according to the present embodiment includes an operation (S10) of preparing a wafer chuck, an operation (S20) of disposing a wafer with semiconductor devices formed thereon on the wafer chuck, an operation (S30) of irradiating light for measurement to the wafer chuck with the wafer disposed thereon and collecting light for measurement reflected from a surface of the wafer chuck, an operation (S40) of determining regions of the wafer to be severed on the basis of information obtained from the collected light, and an operation (S50) of cutting the disposed wafer according to the determined cutting lines. The respective operations will be described in detail hereinafter.

The method for manufacturing a semiconductor device according to the present embodiment starts with the operation (S10) of preparing a wafer chuck. The operation (S10) will be described with reference to FIG. 2.

Figure 2:
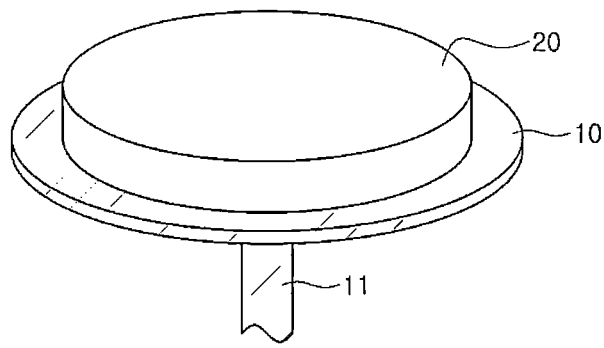
FIG. 2 is a perspective view schematically illustrating a wafer chuck disposed on a stage according to an embodiment of the present inventive concepts.

FIG. 2 is a perspective view schematically illustrating a wafer chuck 20 disposed on a stage 10 according to an embodiment of the present inventive concepts. The stage 10 may include a rotating unit 11 such as a motor connected to a shaft configured to rotate a surface of the stage 10 on which the wafer chuck 20 is disposed. The wafer chuck 20 is described as being separately provided from the stage 10, but the present inventive concept is not limited thereto. Namely, the wafer chuck 20 may be integrally provided with the stage 10. For example, the wafer chuck 20 may be configured to include the rotating unit 11, without having to be disposed on the separate stage 10.

The wafer chuck 20 may have a white surface.

Here, 'white surface' may be defined by a whiteness index and/or reflectivity with respect to an applied wavelength. In detail, the wafer chuck 20 according to the present embodiment may have a surface having a whiteness index equal to or greater than 90. The 'whiteness index' can be calculated according to the Hunter L,a,b scheme on the basis of the Commission Internationale de l'Eclairage's (CIE, International Commission on Illumination) color definition, international standards, and related definitions and regulation methods may be understood with reference to items E308 and E1347 of the American Society for Testing and Materials (ASTM). The wafer chuck 20 may be made of ceramics containing aluminum oxide ($Al_2O_3$) as a main ingredient and sintered by using a binder, but the present inventive concept is not limited thereto. In this case, purity of the aluminum oxide ($Al_2O_3$) may be equal to or greater than about 95% (wt %). The whiteness index of the surface of the wafer chuck 20 may be obtained by adjusting the purity of the aluminum oxide ($Al_2O_3$) or by using a method such as coating using a white material.

Also, according to an embodiment of the present inventive concepts, the surface of the wafer chuck 20 may have reflectivity equal to or greater than 40% (or, in some examples, equal to or greater than 50%) with respect to light having a wavelength ranging from 380 nm to 780 nm, respectively. The surface of the wafer chuck 20 may have reflectivity equal to or greater than 70%, specifically, ranging from about 74% to 90%, with respect to a wavelength (ranging from 380 nm to 780 nm) of irradiated light, but the present inventive concepts are not limited thereto, and an average of the reflectivity may equal to or greater than 80% with respect to light having a wavelength ranging from 380 nm to 780 nm. The reflectivity measure corresponds to total reflection.

In the present embodiment, the wafer chuck 20 may be porous. For example, the wafer chuck 20 may be formed of a porous ceramic material. When a porous wafer is disposed on the wafer chuck 20, the wafer may be effectively fixed to the wafer chuck 20. In detail, when the wafer is disposed on the wafer chuck 20, vacuum adsorption is undertaken through the pores, allowing the wafer to be effectively fixed to the wafer chuck 20. Meanwhile, in the present embodiment, the wafer chuck 20 may have a thickness ranging from about 10 mm to 12 mm, but the present inventive concepts are not limited thereto and the wafer chuck 20 may have various other thicknesses as necessary.

Thereafter, the wafer with the semiconductor devices formed thereon is disposed on the wafer chuck 20 (S20). This will be described in detail through FIGS. 3 through 5.

Figure 3:
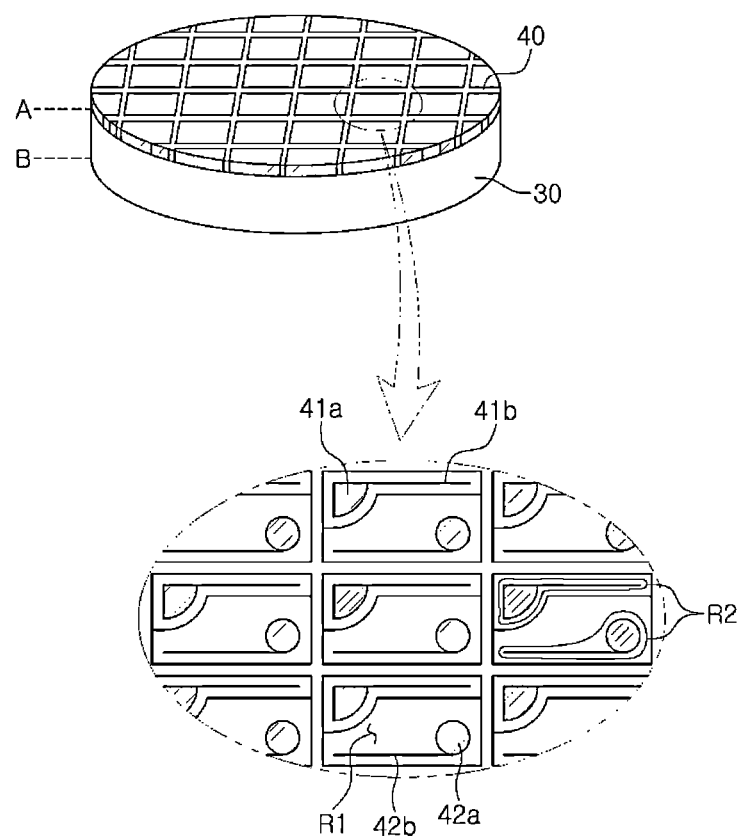
FIG. 3 is a perspective view schematically illustrating a wafer with semiconductor devices formed thereon according to an embodiment of the present inventive concepts.
Figure 4A:
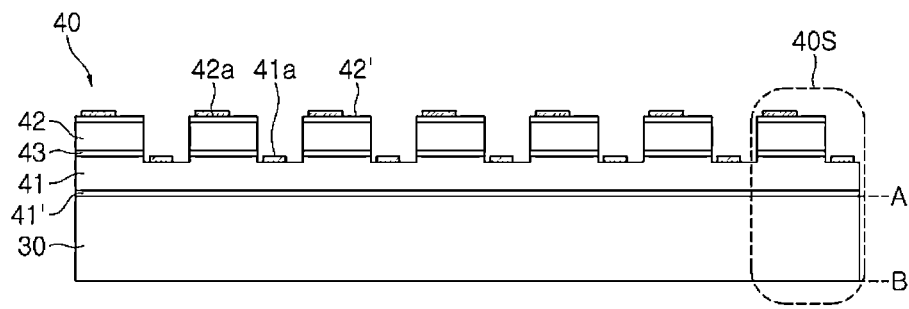
FIGS. 4A and 4B are cross-sectional views of the wafer with semiconductor devices formed thereon according to an embodiment of the present inventive concepts.
Figure 4B:
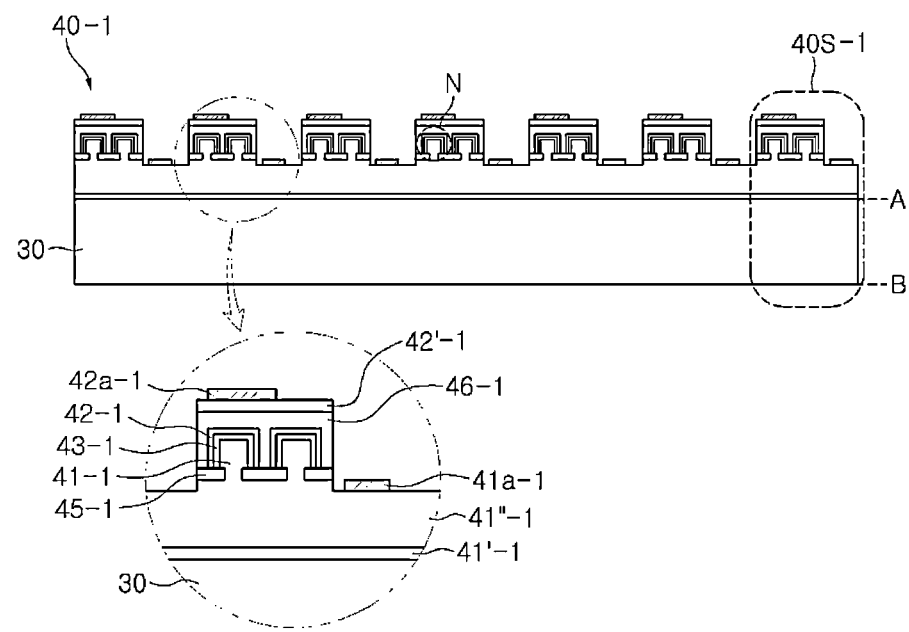
Figure 5:
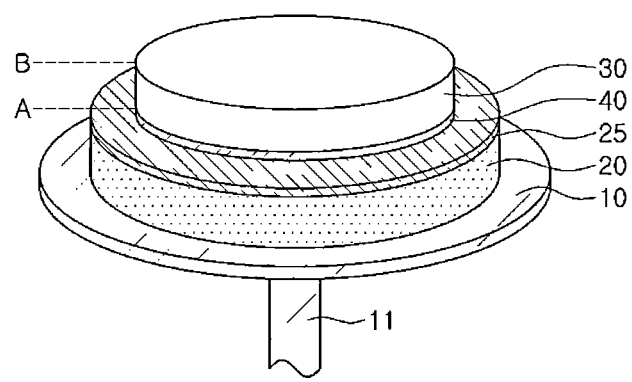
FIG. 5 is a perspective view illustrating a wafer disposed on a wafer chuck according to an embodiment of the present inventive concepts.

FIG. 3 is a perspective view schematically illustrating a wafer 30 with semiconductor devices 40 formed thereon according to an embodiment of the present inventive concepts. FIGS. 4A and 4B are cross-sectional views of the wafer 30 with semiconductor devices 40 formed thereon according to an embodiment of the present inventive concepts. FIG. 5 is a perspective view illustrating a state in which the operation (S20) is completed.

Referring to FIG. 3, the semiconductor devices 40 are formed on the wafer 30. The wafer 30 may have a surface 'A' on which the semiconductor devices 40 are formed (e.g., the upper surface in FIG. 3) and a surface 'B' opposite to surface 'A' (e.g., the lower surface in FIG. 3). The semiconductor device 40 may be disposed on the wafer 30 according to a regular repeated pattern, such as in a grid pattern disposed in rows and columns. A space between the semiconductor devices 40 on the surface of the wafer 30 can be provided as a cutting area for cutting the wafer and separating the semiconductor devices 40 from each other.

During the operation (S20), the semiconductor devices 40 are not yet separated and the wafer 30 is not yet severed into individual device units. Namely, the semiconductor devices 40 still need to be separated by severing the wafer into respective individual semiconductor devices 40 through a follow-up process. An example of the wafer 30 and the semiconductor devices 40 according to the present inventive concepts will be described in detail.

In the present embodiment, the wafer 30 may be a growth substrate provided for the purpose of growing the semiconductor devices 40. The wafer 30 may be transparent or translucent.

In detail, the wafer 30 may be made of an insulating, conductive, or semiconductor material such as sapphire, silicon (Si), SiC, $MgAl_2O_4$, MgO, $LiAlO_2$, $LiGaO_2$, GaN, and the like. In this case, a sapphire substrate having electrical insulating properties may be preferably used. Sapphire is a crystal having Hexa-Rhombo R3c symmetry, of which lattice constants in c-axial and a-axial directions are approximately 13.001 Å and 4.758 Å, respectively, and has a C-plane (0001), an A-plane (1120), an R-plane (1102), and the like. In this case, the C-plane of sapphire crystal allows a material of the semiconductor devices 40, e.g., a nitride semiconductor, to be relatively easily grown thereon and is stable at high temperatures, so sapphire can be used as a nitride growth wafer.

However, the present inventive subject matter is not limited thereto, and any other materials may also be used as long as it is appropriate as a material of the wafer 30. For example, another material appropriate to be used as a material of the wafer 30 may be silicon (Si). In this case, since a silicon (Si) wafer may have a large diameter and may be relatively low in price, and employment of such a silicon wafer may be advantageous in mass-production. In the case of using a silicon (Si) wafer, a nucleation layer made of a material such as $Al_xGa_{1-x}N$ may be formed on a wafer and a semiconductor having a desired structure, e.g. a nitride semiconductor, may be grown on the nucleation layer.

In the present embodiment, each of the semiconductor devices 40 may have electrode pads 41a and 42a and one or more electrode fingers 41b and 42b extending from the electrode pads 41a and 42a, respectively. Thus, the electrode pads 41a and 42a and the electrode fingers 41b and 42b may form predetermined electrode patterns on each of the semiconductor devices 40. Here, each of the semiconductor devices 40 may have a region R1 in which the semiconductor layer is exposed and a region R2 in which the electrode patterns are exposed. In particular, region R1 may not have electrode patterns formed therein.

The electrode pads 41a and 42a are provided as electrical connection terminals for each semiconductor device 40, and serve as a conduit for applying driving power to the device. The electrode pads 41a and 42a may be made of a material selected from among silver (Ag), aluminum (Al), nickel (Ni), chromium (Cr), palladium (Pd), copper (Cu), platinum (Pt), tin (Sn), tungsten (W), gold (Au), rhodium (Rh), iridium (Ir), ruthenium (Ru), magnesium (Mg), zinc (Zn), and the like, and may be formed through a process such as deposition, sputtering, plating, or the like. Also, the electrode pads 41a and 42a may have a structure including two or more layers such as Ni/Ag, Zn/Ag, Ni/Al, Zn/Al, Pd/Ag, Pd/Al, Ir/Ag, Ir/Au, Pt/Ag, Pt/Al, Ni/Ag/Pt, or the like. However, any other material may be used to form the electrode pads 41a and 42a as long as it has conductivity. Here, the one or more electrode fingers 41b and 42b respectively extending from the electrode pads 41a and 42a may easily induce current spreading.

The semiconductor devices 40 may be, for example, semiconductor light emitting devices emitting light having a predetermined wavelength when an electrical signal is applied thereto, but the present inventive subject matter is not limited thereto. An exemplary embodiment including semiconductor light emitting devices will be described in detail with reference to FIGS. 4A and 4B.

FIGS. 4A and 4B are cross-sectional views of the wafer 30 with semiconductor devices 40 formed thereon according to an embodiment of the present inventive subject matter.

First, referring to FIG. 4A, a semiconductor device 40 according to the present embodiment may be a semiconductor light emitting device including a first conductivity-type semiconductor layer 41 formed on the wafer 30, an active layer 43 formed on the first conductivity-type semiconductor layer 41, and a second conductivity-type semiconductor layer 42 formed on the active layer 43.

The first and second conductivity-type semiconductor layers 41 and 42 may be configured as semiconductor layers doped with n-type and p-type impurities, respectively. However, the present inventive subject matter is not limited thereto and, conversely, the first and second conductivity-type semiconductor layers 41 and 42 may be p-type and n-type semiconductor layers, respectively. Also, the first and second conductivity-type semiconductor layers 41 and 42 may be made of a nitride semiconductor, e.g., a material having a composition of $Al_xIn_yGa_{1-x-y}N$ ($0 \leq x \leq 1$, $0 \leq y \leq 1$, $0 \leq x+y \leq 1$). Besides, the first and second conductivity-type semiconductor layers 41 and 42 may also be made of a material such as an AlGaInP-based semiconductor or an AlGaAs-based semiconductor.

The active layer 43 formed between the first and second conductivity-type semiconductor layers 41 and 42 emits light having a predetermined level of energy according to the recombination of electrons and holes and may have a multi-quantum well (MQW) structure in which quantum well layers and quantum barrier layers are alternately laminated at least twice. For example, in the case of a nitride semiconductor, the active layer 43 may have a structure in which the quantum well layer is made of InGaN (the content of indium (In) may vary) and the quantum barrier layer is made of GaN.

The first and second conductivity-type semiconductor layers 41 and 42 and the active layer 43 may be formed by applying a process such as metal organic chemical vapor deposition (MOCVD), hydride vapor phase epitaxy (HYPE), molecular beam epitaxy (MBE), or the like to the wafer 30.

In the present embodiment, a buffer layer 41' may be interposed between the wafer 30 and the first conductivity-type semiconductor layer 41. In general, in a case in which a semiconductor material is grown on the wafer 30, for example in a case in which a GaN thin film is grown on the wafer 30 made of sapphire, a lattice constant mismatch between the wafer 30 and the GaN thin film may cause a lattice defect such as dislocations. Additionally, a difference in coefficients of thermal expansion between the wafer 30 and the semiconductor material grown thereon may cause the wafer 30 to be bowed (or warped), and may result in the generation of cracks in the semiconductor layer. In order to control and reduce the occurrence of such defects and bowing (or warpage), the buffer layer 41 may be formed on the wafer 30. A semiconductor layer having a desired structure, e.g., the first conductivity-type semiconductor layer 41 made of a nitride semiconductor, may then be grown on the buffer layer 41'. The buffer layer 41' may be a low temperature buffer layer formed at a temperature lower than a growth temperature of a single crystal constituting the semiconductor layer, but the present inventive subject matter is not limited thereto.

As a material for forming the buffer layer 41', $Al_xIn_yGa_{1-x-y}N$ ($0 \leq x \leq 1$, $0 \leq y \leq 1$), in particular, GaN, AlN, or AlGaN, may be used. For example, the buffer layer 41' may be an undoped GaN layer without impurities.

Of course, the present inventive subject matter is not limited thereto and any structure may be employed as long as it can enhance crystallinity of the semiconductor device 40 formed on the wafer 30, and a material such as $ZrB_2$, $HfB_2$, ZrN, HfN, TiN, ZnO, or the like, may be used. Also, the buffer layer 41' may be formed by combining a plurality of layers, or may be formed as a layer in which compositions of component materials are gradually changed.

Meanwhile, an ohmic-electrode layer 42' may be formed between the second conductivity-type semiconductor layer 42 and the electrode pad 42a formed on the second conductivity-type semiconductor layer 42. The ohmic-electrode layer 42' may be made of a material exhibiting electrical ohmic-characteristics with respect to the second conductivity-type semiconductor layer 42. In case of a semiconductor light emitting device having a structure in which light generated by the active layer 43 is output externally by way of the second conductivity-type semiconductor layer 42, the ohmic-electrode layer 42' may be made of a transparent conductive oxide such as ITO, CIO, ZnO, or the like, having relatively good ohmic-contact performance, while having a high degree of light transmittance, among materials for a transparent electrode, but the present inventive subject matter is not limited thereto.

In an example, referring to FIG. 4B, the semiconductor device 40-1 according to the present embodiment may be a semiconductor light emitting device implemented as a nanoscale-LED chip.

Referring to FIG. 4B, the semiconductor device 40-1 includes a plurality of nanoscale-light emitting structures N formed on the wafer 30. In this example, each of the nanoscale-light emitting structures N has a core-shell structure as a rod structure, but the present inventive subject matter is not limited thereto and each of the nanoscale-light emitting structures N may have a different structure such as a pyramid structure.

In detail, the semiconductor device 40-1 includes a base layer 41"-1 formed on the wafer 30. A buffer layer 41'-1 may be disposed between the base layer 41"-1 and the wafer 30. The base layer 41"-1, providing a growth surface of the nanoscale-light emitting structure N, may be a first conductivity-type semiconductor layer. A mask layer 45-1 having an open region for the growth of the nanoscale-light emitting structure N may be formed on the base layer 41"-1. The mask layer 45-1 may be formed of a dielectric material such as $SiO_2$ or $SiN_x$.

Regarding the nanoscale-light emitting structure N, a first conductivity-type semiconductor is selectively grown by using the mask layer having the open region. The growth of the first conductivity-type semiconductor through the open region forms the first conductivity-type nanocore 41-1, and the active layer 43-1 and the second conductivity-type semiconductor layer 42-1 are formed as shell layers on a surface of the nanocore 41-1. Accordingly, the nanoscale-light emitting structure N may have a core-shell structure in which the first conductivity-type semiconductor is the nanocore 41-1 and the active layer 43-1 and the second conductivity-type semiconductor layer 42-1 are shell layers covering the nanocore 41-1.

Also, the semiconductor device 40-1 may include a filler material 46-1 filling a space between the nanoscale-light emitting structures N. The filler material 46-1 may structurally stabilize the nanoscale-light emitting structures N. The filler material 46-1 may be made of a transparent material such as $SiO_2$, but the present inventive subject matter is not limited thereto. The ohmic-electrode layer 42'-1 may be formed on the nanoscale-light emitting structure N such that it is connected to the second conductivity-type semiconductor layer 42-1. The semiconductor device 40-1 may include the electrode pads 41a-1 and 42a-1 connected to the base layer 41"-1 formed of the first conductivity-type semiconductor and the ohmic-electrode layer 42'-1, respectively. Regarding the so-called nanoscale-LED chip according to the present embodiment, a method for manufacturing a nanoscale-LED according to an embodiment disclosed in Korean Patent Application No. 10-2012-0054444 filed by the present applicant may be referred to.

Meanwhile, as mentioned above, the semiconductor devices 40 and 40-1 shown in FIGS. 4A and 4B have not been separated into individual device units. Following cutting of the wafer 30, individual semiconductor devices (e.g., 40S and 40S-1) are formed from the wafer 30 and semiconductor devices formed thereon. In order to separate and sever the semiconductor devices 40S and 40S-1, the wafer 30 is disposed on the wafer chuck 20. A state in which the wafer 30 is disposed on the wafer chuck 20 is illustrated in FIG. 5.

FIG. 5 is a perspective view illustrating the wafer 30 disposed on the wafer chuck 20 according to an embodiment of the present inventive subject matter. Here, the semiconductor device 40 is illustrated as a thin film because it has a thickness smaller than that of the wafer 30, but the thickness, or the like, of the semiconductor device 40 is not limited thereto.

Referring to FIG. 5, the wafer 30 is disposed such that surface 'A' thereof on which the semiconductor device 40 is formed faces the wafer chuck 20. In this case, damage to the semiconductor device 40, such as damage to the semiconductor device 40 occurring during a cutting operation, may be prevented. Namely, laser light for the purpose of separation and cutting may be irradiated to the wafer 30 with the semiconductor device 40 formed thereon. In order to prevent the semiconductor device 40 from being directly exposed to laser light, the wafer 30 may be disposed such that surface 'A' thereof faces the wafer chuck 20.

Meanwhile, an adhesive member 25 such as an adhesive tape may be disposed between surface 'A' and a surface of the wafer chuck 20. The adhesive member 25 serves to prevent the arrangement of semiconductor devices 40 on the wafer 30 from being disordered when the wafer 30 is separated and severed into respective individual device units. The adhesive member 25 may be made of a transparent material. Also, the adhesive member 25 may be made of an elastic material. In the case in which the adhesive member 25 is made of an elastic material, after the semiconductor devices 40 are separated and severed into individual semiconductor devices 40S, spaces between the individual semiconductor devices 40S can be easily widened by stretching out the elastic adhesive member 25. Since the spaces between the separated and severed individual semiconductor devices 40S are widened, process convenience can be guaranteed in performing a follow-up process on each of the individual semiconductor devices 40S.

Referring back to the flow diagram of FIG. 1, after the wafer has been disposed on the wafer chuck (step S20), light for measurement is irradiated to the wafer chuck 20 with the wafer 30 disposed thereon. Light reflected from a surface of the wafer chuck 20 is collected for measurement (S30). This operation (S30) will be described in more detail with reference to FIG. 6.

Figure 6:
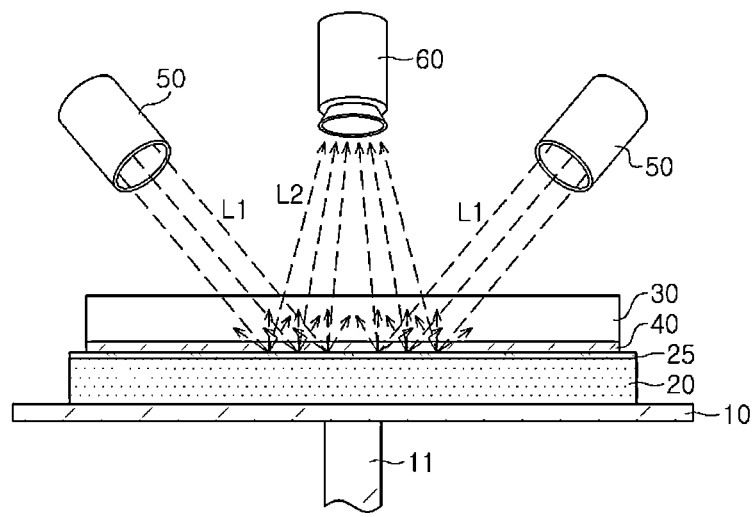
FIG. 6 is a cross-sectional view illustrating a process of irradiating light for measurement to a wafer chuck with a wafer disposed thereon, and collecting light reflected from a surface of the wafer chuck according to an embodiment of the present inventive concepts.

FIG. 6 is a cross-sectional view illustrating a process of irradiating light L1 to the wafer chuck 20 with the wafer 30 disposed thereon, and collecting light L2 reflected from a surface of the wafer chuck according to an embodiment of the present inventive subject matter.

In the present embodiment, light L1 may be of any color or wavelength of visible rays, for example, and it may be a monochromatic light or mixed light. As illustrated, the light L1 for measurement irradiated to the wafer chuck 20 may be irradiated in a lateral direction to the wafer chuck 20.

In operation S30, the light L1 may be output from a light source 50, pass through the wafer 30 and the semiconductor device 40 formed on the wafer 30, and be reflected from the surface of the wafer chuck 20 as reflected light L2. Light L2 may then pass through the semiconductor layer 40 and the wafer 30, and be emitted upwardly from the wafer chuck 20. The reflected light L2 which is emitted upwardly may be collected by using an image capture device 60. The light L1 and L2 may thus be used for measurement by being captured by the image capture device 60.

In detail, during the operation S30, the reflected light L2 is collected for measurement. A surface of the wafer chuck 20 on which the wafer 30 is disposed can thus be imaged by using the reflected light L2 that is collected by image capture device 60. Image capture device 60 can be a charge coupled device (CCD) camera disposed directly above the wafer chuck 20. The information obtained from collected light in this operation (S30) may be information in the form of an image. On the basis of the obtained image information, regions of the wafer 30 to be severed may be determined in a next operation.

According to the present embodiment, the surface of the wafer chuck 20 may have reflectivity equal to or greater than 40% (or, in some examples, equal to or greater than 50%) with respect to light having a wavelength ranging from 380 nm to 780 nm. Thus, in the case in which the light L1 for measurement irradiated to the wafer chuck 20 has a wavelength ranging from 380 nm to 780 nm, about 50% or more of the light L1 reaching the wafer chuck 20 may be reflected from the surface of the wafer chuck 20 as light L2. Thus, since the amount of light L2 reflected from the surface of the wafer chuck 20 is increased, the image capture device 60 can easily collect the reflected light L2 for measurement.

Thereafter, regions of the wafer 30 to be severed are identified on the basis of the information obtained from the collected light (S40). During operation S40, regions of the wafer 30 to be severed may be determined on the basis of the image information obtained from the image captured by using the image capture device 60, for example.

Figure 7:
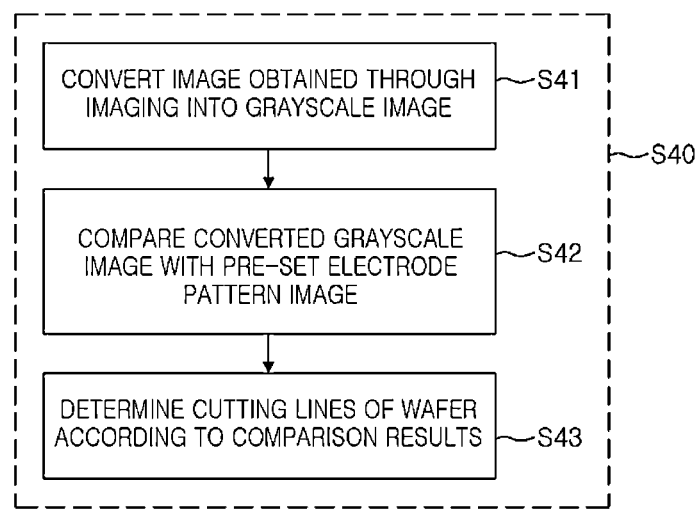
FIG. 7 is a flow chart illustrating an example of a process for determining regions of the wafer to be severed on the basis of information obtained from the collected light.

In detail, as illustrated in FIG. 7, operation S40 may include an operation (S41) of converting an image obtained through the imaging into a grayscale image, an operation (S42) of comparing the converted grayscale image with a pre-set electrode pattern image, and an operation (S43) of determining regions of the wafer to be severed according to the comparison results. This will be described in detail with reference to FIGS. 8 through 10.

Figure 8:
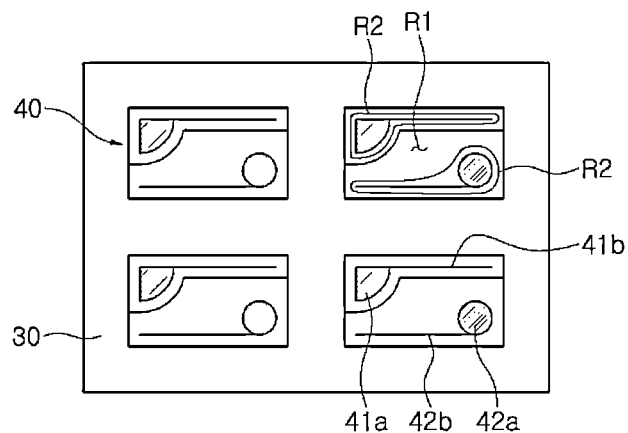
FIG. 8 is a view schematically illustrating a grayscale image obtained after performing an operation (S41) of converting an image obtained through imaging into the graph scale image according to the embodiment in FIG. 7.

FIG. 8 is a view schematically illustrating a grayscale image obtained after performing the operation (S41) of converting the image obtained through imaging into the grayscale image. Here, the grayscale conversion may alternatively convert the image into black and white.

As illustrated in FIG. 8, the converted grayscale image has different brightness values in region R1 of the semiconductor device 40 as compared to region R2. Region R1 may include a region of the semiconductor device 40 in which the semiconductor layer is exposed, while region R2 may including a region of the semiconductor device 40 in which the electrode pattern is exposed. In general, the electrode pattern may impede passage of light through the semiconductor device 40 and wafer 30, and in particular through region R2 of the semiconductor device 40 and wafer 30.

In detail, light L1 that is incident on the region R2 of the semiconductor device 40 in which the electrode pattern is exposed may be lost and not reach the surface of the wafer chuck 20 to be reflected, as the light L1 cannot pass through the electrode pads 41a and 42a or the electrode fingers 41b and 42b. As such, light emitted by the light source is not reflected by the surface of the wafer chuck 20 to the image capture device in regions of the wafer chuck 20 located below the region R2 of the semiconductor devices 40. Additionally, the light L1 that is incident on region R2 may be reflected from the electrode pads 41a and 42a or the electrode fingers 41b and 42b. However, light reflected on the electrode pads and fingers 41a-b and 42a-b is not emitted in direction directly overhead of the wafer chuck 20, and thus an amount of the light reflected on the electrode pads and fingers and collected by the image capture device 60 disposed right above the wafer chuck 20 is small. Thus, the region R2 in which the electrode pattern is exposed has a low brightness value in the converted grayscale image.

Meanwhile, the semiconductor layer is exposed in the region R1 of the semiconductor device 40 in which no electrode pads or fingers are disposed. The light L1 incident on the surface of the wafer 30 in region R1 is transmitted through the wafer 30 and the semiconductor layers 41, 42, and 43 to the wafer chuck, and is scattered-reflected from the surface of the wafer chuck 20. A considerable amount of the scattered-reflected light is emitted in the direction directly overhead of the wafer chuck 20 so as to be incident on the image capture device 60. In particular, in the present embodiment, because the wafer chuck 20 has a surface having a white color, scattered-reflection may occur easily on the surface of the wafer chuck 20. Also, in terms of the brightness characteristics of white color and the foregoing reflectivity characteristics (reflectivity equal to or greater than about 40%; the reflectivity refers to total reflectivity), the region R1 in which the semiconductor layer is exposed may have a relatively high brightness value in the converted grayscale image.

Meanwhile, in order to determine regions of the wafer 30 to be severed, the converted grayscale image is compared with a pre-set electrode pattern image. Cutting lines are then determined according to the comparison results and the location of at least one pre-set cutting line in the pre-set electrode pattern image. For example, in a case in which the pre-set electrode pattern image matches a location in the converted grayscale image with pre-set matching rate (%), the matching location is identified on the wafer 30. Then, the location of cutting lines on the wafer 30 are determined from the matching location and the location of the at least one pre-set cutting line in the pre-set electrode pattern image. Thus, the regions of the wafer 30 to be cut may be determined.

Information in the converted grayscale image may be brightness information of the image, wherein each pixel in the converted grayscale image has a value corresponding to a brightness at the pixel location. As a difference in brightness values between the region R2 (in which the electrode pattern is exposed) and the region R1 (in which the semiconductor layer is exposed) is increased, the locations in the converted grayscale image that match the pre-set pattern image may be more clearly recognized. Specifically, a matching rate (%) between the converted grayscale image and the pre-set electrode pattern image may be high, and the matching locations may be identified without error.

In order to determine the locations of the cutting lines on the wafer 30, it is important to clearly discriminate between the brightness of the region R2 in which the electrode pattern is exposed and the brightness of the region R1 in which the semiconductor layer is exposed. According to the present embodiment, the regions R1 and R2 of the converted grayscale image may be controlled to have a significant brightness difference. Accordingly, a recognition rate of the electrode pattern in a follow-up process can be improved, and an error rate can be effectively reduced while determining regions of the wafer to be cut.

In the converted grayscale image according to the present embodiment, a brightness value of the region R1 in which the semiconductor layer is exposed may be equal to or greater than 150 and a difference in brightness values between the regions R1 and R2 (contrast) may be equal to or greater than 25, but the present inventive subject matter is not limited thereto. Meanwhile, in the present disclosure, a 'brightness value' may be understood to mean a so-called 'gray level' of a pixel determining a brightness value in numerical values ranging from 0 to 255 by binarizing an image.

Meanwhile, the operation (S41) is not essential in performing the process. Operation S41 may thus be excluded according to circumstances. For example, if the surface of the wafer chuck 20 on which the wafer 30 is disposed is imaged by using a CCD camera to obtain an image (which has been already converted into a grayscale image) in the operation (S30) of collecting light for measurement, the operation (S41) may be excluded.

Thereafter, the converted grayscale image is compared with a pre-set electrode pattern image (S42). The pre-set electrode pattern image may be one of the images illustrated in FIGS. 9A through 9C.

As illustrated, the pre-set electrode pattern image may be previously set to have a shape matched to the electrode pattern formed on the semiconductor device 40, and it may have a particular pattern shape. For example, the pre-set electrode pattern image may be an image having two electrode pads 41a' and 42a' as illustrated in FIG. 9A, or may be an image including electrode pads and electrode fingers 41a' and 41b' or 42a' and 42b' as illustrated in FIGS. 9B and 9C. The two electrode pads 41a' and 42a' illustrated a pre-set electrode pattern image may be electrode pads of two or more adjacent semiconductor devices 40 located on wafer 30. One or more cutting lines associated with the pre-set image may separate the two or more adjacent semiconductor devices 40.

Thereafter, regions of the wafer 30 to be cut are determined according to the comparison results (S43). In operation S43, when the converted grayscale image and the pre-set electrode pattern image satisfy a pre-set matching rate (%), locations of cutting lines on the wafer 30 may be determined. The locations of cutting lines on the wafer 30 are determined based on the location on the wafer 30 that is matched to the pre-set electrode pattern image, and the location of at least one cutting line associated with the pre-set electrode pattern image.

In detail, as illustrated in FIG. 10, for example, it is determined whether the pre-set electrode pattern image M1 (as illustrated in FIG. 9A) and a location on the converted grayscale image are matched. When a matching rate therebetween is determined to be equal to or greater than the pre-set matching rage (%), the matched location on the wafer 30 is recognized to be properly aligned and the cutting lines C indicated by the alternate long and short dash line may be set.

The matching rate may be calculated by comparing values of a plurality of pixels of the converted grayscale image and values of pixels of the image M1 having the pre-set electrode pattern, and calculating a rate of pixels that correspond to each other among the entire pixels.

Thereafter, the disposed wafer 30 is cut along the determined cutting lines C (S50). Operation S50 will be described with reference to FIGS. 11 and 12.

Figure 11:
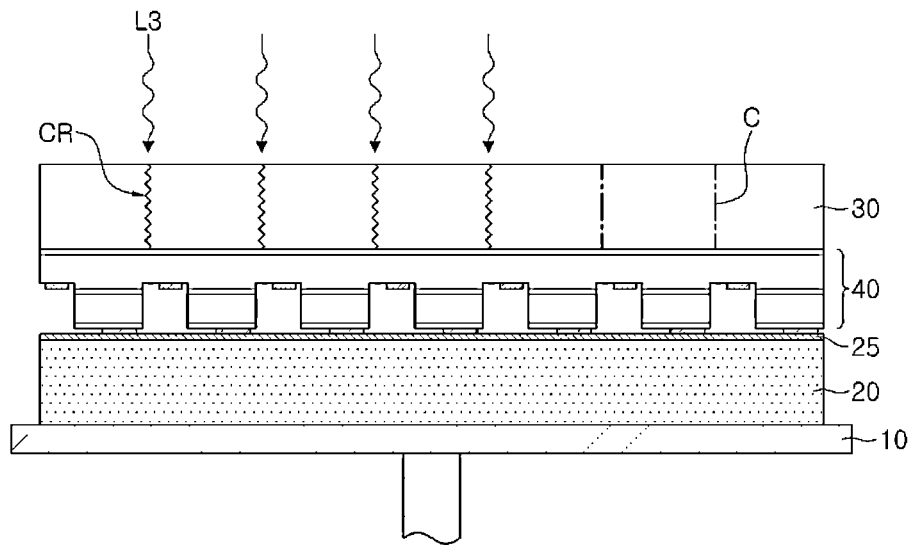
FIGS. 11 and 12 are cross-sectional views specifically illustrating an example of an operation for cutting the disposed wafer according to predetermined cutting lines according to an embodiment of the present inventive concepts.

Referring to FIG. 11, the operation S50 may include an operation of irradiating a laser along the determined cutting lines C on the wafer 30. Namely, the process of cutting the wafer 30 may be understood as applying a laser scribing process. For example, laser light L3 may be irradiated to a wafer 30 made of sapphire to form cracks (CR) in the wafer 30.

Figure 12:
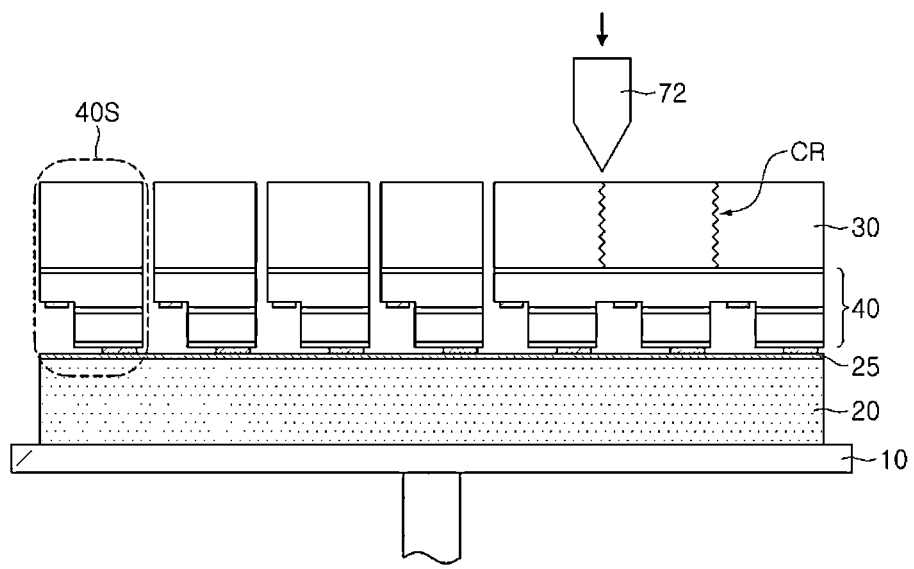

Thereafter, as illustrated in FIG. 12, the crack CR portions generated along the determined cutting lines are pressurized by a breaker 72. Through this process, the semiconductor devices 40 formed on the wafer 30 may be separated and cut into the semiconductor devices 40S as respective individual device units.

Figure 13A:
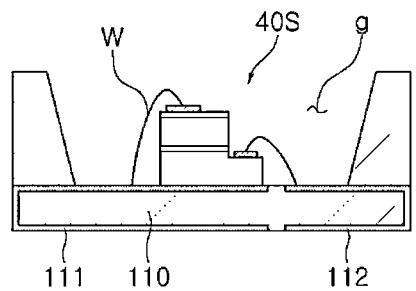
FIGS. 13A through 13C are cross-sectional views illustrating processes for forming a light emitting device package with a semiconductor device after semiconductor devices formed on the wafer are separated into respective individual device units.
Figure 13B:
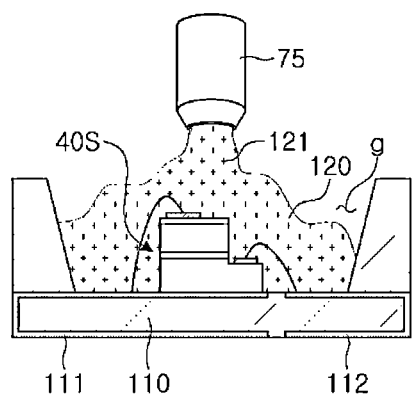
Figure 13C:
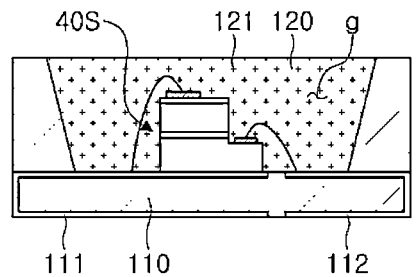

FIGS. 13A through 13C are cross-sectional views illustrating processes of forming a light emitting device package with a semiconductor device after the semiconductor devices 40 formed on the wafer 30 are separated into the semiconductor devices 40S as respective individual device units.

First, as illustrated in FIG. 13A, the semiconductor device 40S separated as an individual device unit is disposed on a package body 110. However, the package body 110 illustrated herein is merely illustrative and it will be obvious that various types of package body can be utilized.

The package body 110 illustrated in FIG. 13A will be described in detail. The package body 110 may include a cavity g accommodating one or more of the semiconductor devices 40S separated and cut as individual device units, and accommodating first and second electrode units 111 and 112. The first and second electrode units 111 and 112 may receive power from the outside and transmit the same to the semiconductor device(s) 40S. In the present embodiment, the semiconductor device(s) 40S may be semiconductor light emitting device(s).

The package body 110 may be formed of an opaque resin or a resin having a high degree of reflectivity. Also, the package body 110 may be made of a polymer resin that can be easily injection-molded. However, the present inventive subject matter is not limited thereto and the package body 110 may be made of various other non-conductive materials.

The semiconductor device 40S may be disposed on an upper surface of any one of the first and second electrode units 111 and 112, and may be electrically connected to the semiconductor device 40S by using conductive wires W. In the present embodiment, the semiconductor device 40S is illustrated as being disposed on the first electrode unit 111, and in terms of heat dissipation, the first electrode unit 111 on which the semiconductor device 40S is disposed may be greater or larger than the second electrode unit 112.

Thereafter, as illustrated in FIG. 13B, an encapsulator 120 is applied to the cavity g by using a dispenser 75. The encapsulator 120 may be made of a light-transmissive resin such as silicon or epoxy and may include a wavelength conversion material 121 emitting light having a different wavelength upon being excited by light emitted from the semiconductor device 40S. In this case, the wavelength conversion material 121 may include at least one of phosphors and quantum dots.

Thereafter, the encapsulator 120 is cured to form a light emitting device package as illustrated in FIG. 13C.

In the case of the method for manufacturing a semiconductor device according to the present embodiment as described above, since a recognition rate of the electrode pattern is increased, precision can be enhanced in determining the regions of the wafer 30 to be cut.

Figure 14:
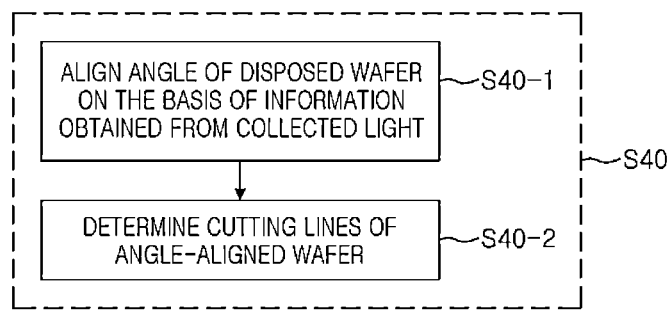
FIG. 14 is a flow chart illustrating an embodiment of the present inventive concepts.

FIG. 14 is a flow chart illustrating a further embodiment of the present inventive subject matter.

The operation S40 of determining regions of the wafer 30 to be cut as described in the former embodiment may further include an operation of aligning an angle of the disposed wafer 30.

In detail, referring to FIG. 14, the operation S40 of determining cutting lines in the wafer 30 illustrated in FIG. 1 may include an operation S40-1 of aligning an angle of the disposed wafer on the basis of information obtained from collected light and an operation S40-2 of determining cutting lines in the angle-aligned wafer. This embodiment will be described in detail with reference to FIGS. 15A and 15B.

Figure 15A:
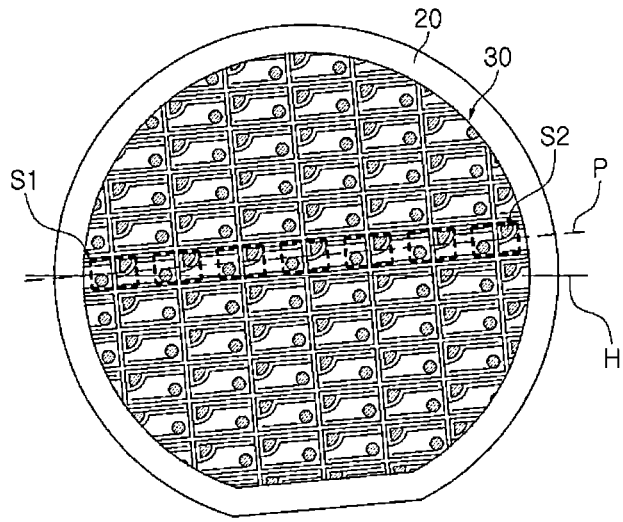
FIGS. 15A and 15B are views specifically illustrating an operation of aligning an angle of the wafer in relation to FIG. 14.
Figure 15B:
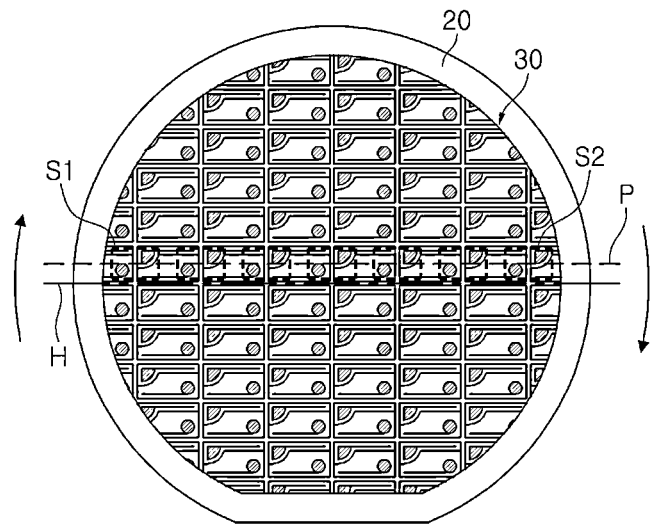

FIGS. 15A and 15B are views illustrating the wafer 30 disposed on the wafer chuck 20. Light for measurement is irradiated to the wafer chuck 20 with the wafer 30 disposed thereon, and light for measurement reflected from the surface of the wafer chuck 20 is collected (e.g., as in operation S30). In the example, semiconductor devices 40 are disposed in rows or columns on the surface of the wafer 30.

Here, referring to FIG. 15A, an electrode pattern obtained from a start point S1 is recognized on the basis of information obtained from collected light. For example, the start point S1 may be a certain point existing in the left side of the wafer 30, but the present inventive subject matter is not limited thereto.

Thereafter, the same electrode pattern as that recognized from the start point S1 is sequentially recognized in a rightward direction from the start point S1 up to an end point S2. For example, the end point S2 may be a point adjacent to a right end of the wafer 30, and located at a distal end of a same row or column of semiconductor devices as start point S1.

Thereafter, it is determined whether a line P extending through the respective electrode patterns recognized from the start point S1 to the end point S2 is parallel or coincident with (or identical to) a pre-set horizontal line H.

When it is determined that the line P extending through the respective electrode patterns recognized from the start point S1 to the end point S2 is parallel to or coincident with the pre-set horizontal line H, the wafer 30 may be determined to be properly aligned on the wafer chuck 20. However, when it is determined that the extending line P is not parallel to or coincident with the pre-set horizontal line H (e.g., as illustrated in FIG. 15A), the wafer 30 may be determined not to align.

If the wafer 30 is not aligned, as illustrated in FIG. 15A, the wafer 30 may be rotated a predetermined angle such that the extending line P is parallel to or coincident with the pre-set horizontal line H as shown in FIG. 15B. To this end, the rotating unit 11 illustrated in FIG. 2 may be provided to the stage on which the wafer chuck 20 is disposed.

Also, a process of sequentially recognizing the same electrode pattern from the end point S2 in a leftward direction up to the start point S1 can be used to re-check whether the extending line P is parallel to or coincident with the pre-set horizontal line H.

According to the present embodiment, since the wafer 30 can be properly aligned, the generation of an error in determining cutting lines can be effectively prevented.

According to the present embodiment, since a recognition rate of electrode patterns can be improved by using the wafer chuck 20 having a surface with a high whiteness index and/or a high reflectivity, the angle alignment can be effectively performed without an error.

Figure 16:
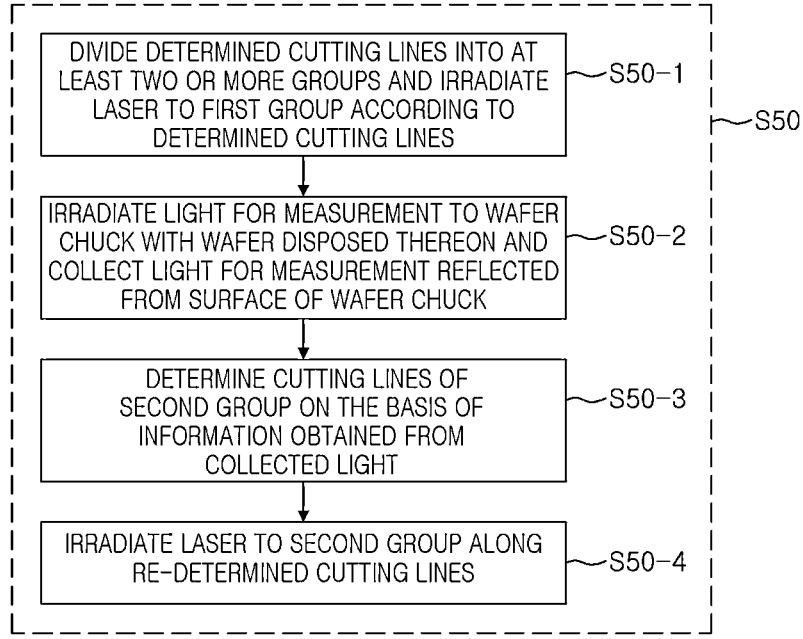
FIG. 16 is a flow chart illustrating an embodiment of the present inventive concepts.

FIG. 16 is a flow chart illustrating another embodiment of the present inventive subject matter.

In an operation (S50) of cutting the wafer disposed as described above, a process of correcting the positioning of cutting lines following cutting process is used to address changes in the positioning of the wafer during the cutting process.

In detail, referring to FIG. 16, the operation (S50) of cutting the disposed wafer includes an operation (S50-1) of dividing determined cutting lines into at least two or more groups, and irradiating a laser to a first group of the determined cutting lines in order to cut the wafer 30. Then, the operation (S50) includes an operation (S50-2) of irradiating light to the wafer chuck with the wafer disposed thereon and collecting light reflected from the surface of the wafer chuck, and an operation (S50-3) of re-determining cutting lines of a second group on the basis of information obtained from the collected light in operation S50-2. Finally, an operation (S50-4) irradiates a laser to the second group of re-determined cutting lines in order to cut the wafer 30 along the second group of cutting lines. This will be described in detail with reference to FIGS. 17A through 17C.

Figure 17A:
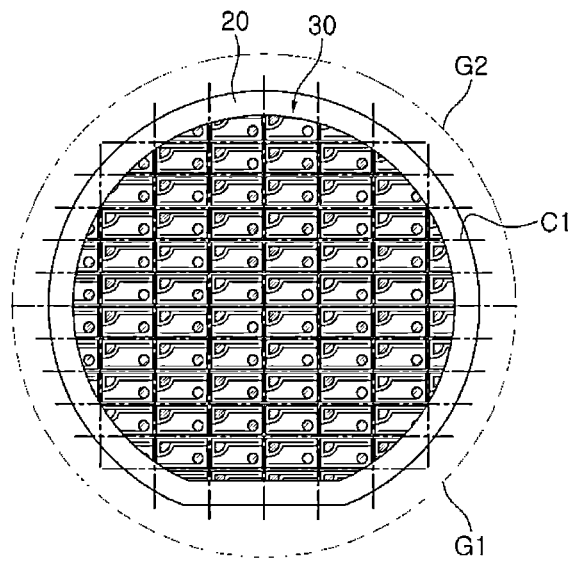
FIGS. 17A through 17C are views specifically illustrating an operation of re-determining regions of a wafer to be severed in relation to FIG. 16.

FIG. 17A illustrates the operation (S30) of irradiating light to the wafer chuck 20 with the wafer 30 disposed thereon and collecting light reflected from the surface of the wafer chuck 20, and the operation (S40) of determining cutting lines on the wafer 30 on the basis of the information obtained from the collected light. Here, first and second groups of cutting lines are denoted by reference letters G1 and G2, respectively, and the determined cutting lines are indicated by alternate long and short dash lines (see, e.g., C1). Each group of cutting lines can include horizontal, vertical, or both horizontal and vertical cutting lines. Thus, in one example, one group of cutting lines includes cutting lines that intersect with and are substantially perpendicular to cutting lines of another group of cutting lines. In another example, the one group includes cutting lines that are substantially parallel to cutting lines of the other group. In a further example, cutting lines of one group are located in a first region of a surface of the wafer, and cutting lines of the other group are located in a second region of the surface of the wafer that is distinct from and non-overlapping with the first region.

Figure 17B:
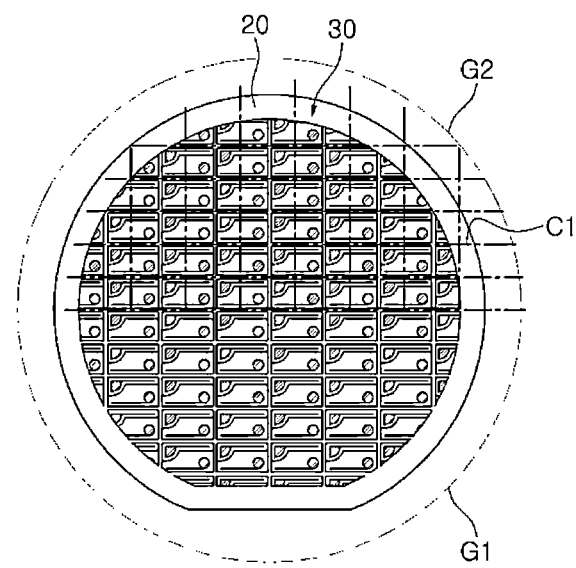

Referring to FIG. 17B, the disposition of the wafer 30 may be changed during the cutting process. For example, when a laser is irradiated along the determined cutting lines of the first group, cracks may be generated in the wafer 30, and thus the previously aligned wafer may be pushed out of alignment. Thus, if a laser is continuously irradiated along the initially determined cutting lines C1, the laser may be irradiated to an undesired portion of the wafer 30 in which the semiconductor device 40 is formed, as illustrated. Thus, the cutting lines may need to be reset during the cutting process in order to avoid inadvertently cutting through semiconductor devices 40.

Referring back to FIG. 17A, in the present embodiment, the already determined cutting lines are divided into at least two or more groups. FIG. 17A illustrates an example in which the previously determined cutting lines C1 are divided into the first and second groups G1 and G2.

A laser is irradiated along cutting lines of the first group G1 according to the determined cutting lines C1 in operation S50-1, and light for measurement is irradiated to the wafer chuck 20 with the wafer 30 disposed thereon and light reflected from the surface of the wafer chuck 20 is collected in operation S50-2.

Figure 17C:
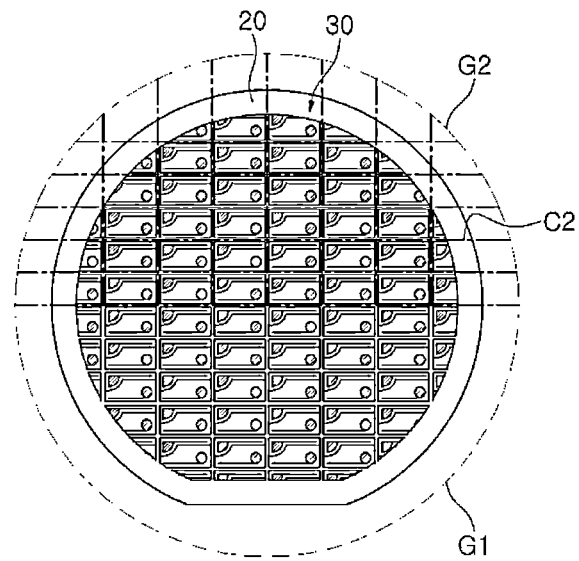

Thereafter, cutting lines of the second group G2 may be re-aligned or re-determined on the basis of the information obtained from the collected light in operation S50-3. Namely, the re-determined cutting lines of the wafer are reset or re-determined in consideration of the fact that the positioning of the wafer 30 may have changed due to irradiation with the laser. FIG. 17C illustrates the cutting lines C2 of the second group being re-determined. Referring to FIG. 17C, it can be seen that mis-placement of cutting does not occur, unlike in FIG. 17B in which cutting lines cut through the semiconductor devices 40.

In this manner, according to the present embodiment, the miscutting problem due to a change in the initially determined cutting lines during the cutting process can be effectively addressed. Here, according to the present embodiment, since the wafer chuck 20 having a surface having a high whiteness index and/or high reflectivity is used, a recognition rate of the electrode patterns is increased, and thus, the cutting lines of the wafer in the second group G2 may be determined without an error.

Figure 18:
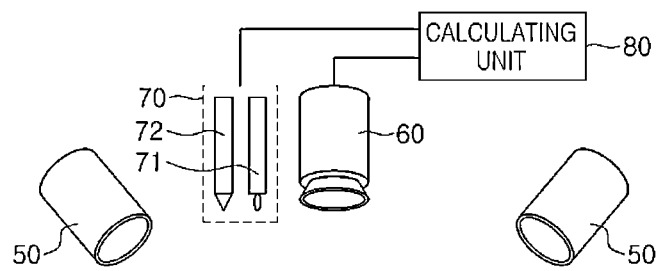
FIG. 18 is a cross-sectional view schematically illustrating an apparatus for manufacturing a semiconductor device according to an embodiment of the present inventive concepts.
Figure 18:
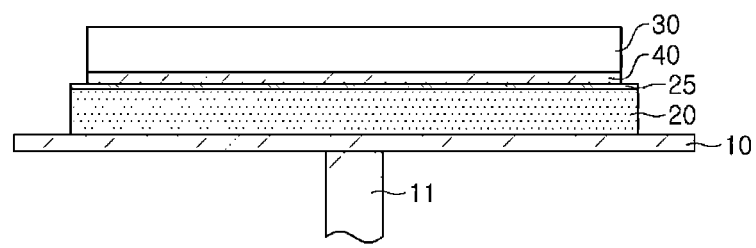

FIG. 18 is a cross-sectional view schematically illustrating an apparatus for manufacturing a semiconductor device according to an embodiment of the present inventive subject matter.

Referring to FIG. 18, the apparatus for manufacturing a semiconductor device according to the present embodiment includes the wafer chuck 20, the light source 50 irradiating light for measurement to the surface of the wafer chuck 20, the image capture device 60 collecting light for measurement reflected from the surface of the wafer chuck 20 after being output from the light source 50, a processor or calculating unit 80 determining cutting lines of the wafer 30 on the basis of the information (e.g., image information) obtained by the image capture device 60, and a cutting assembly 70 cutting the wafer along the cutting lines determined by the processor calculating unit 80.

In the present embodiment, the wafer chuck 20 may be disposed on the stage 10, and the stage 10 may include the rotating unit 11 for rotating the surface in which the wafer chuck 20 is disposed. Meanwhile, in the present embodiment, the wafer chuck 20 is separately provided apart from the stage 10, but the present inventive subject matter is not limited thereto. Namely, as mentioned above, the wafer chuck 20 may be integrally provided with the stage 10. For example, the wafer chuck 20 may be provided to include the rotating unit 11, without having to be disposed on the separate stage 10.

In the present embodiment, the wafer chuck 20 may have a surface having a white color. Here, the "white color" of the surface of the wafer chuck 20 may be defined by a high whiteness index or high reflectivity with respect to an applied wavelength of light. In detail, the wafer chuck 20 according to the present embodiment may have a surface having a whiteness index equal to or greater than 90.

The wafer chuck 20 may be made of ceramic including aluminum oxide ($Al_2O_3$) as a main ingredient and sintered by using a binder. Here, the whiteness index of the surface of the wafer chuck 20 may be regulated by adjusting purity of the aluminum oxide ($Al_2O_3$) or by using a method such as coating using a white material, or the like.

Also, the surface of the wafer chuck 20 may have reflectivity equal to or greater than 40% (or, in some examples, equal to or greater than 50%) with respect to light having a wavelength ranging from 380 nm to 780 nm. The surface of the wafer chuck 20 may have reflectivity equal to or greater than 70%, specifically, ranging from about 74% to 90%, with respect to irradiated light having a wavelength ranging from 380 nm to 780 nm, and an average of the reflectivity may be equal to or greater than an 80% with respect to light having the wavelength ranging from 380 nm to 780 nm. However, the present inventive subject matter is not limited thereto.

Meanwhile, the adhesive member 25 may be interposed between the wafer chuck 20 and the wafer 30. The adhesive member 25 may serve to prevent the location of the wafer 30 and semiconductor devices 40 from being changed when the wafer 30 with the semiconductor devices 40 formed thereon is separated and severed into respective individual device units. Here, the adhesive member 25 may be made of a transparent material. Also, as mentioned above, the adhesive member 25 may be made of an elastic material.

The light source 50 may irradiate light for measurement to the surface of the wafer chuck 20, and the light for measurement may be visible light. The visible light may be monochromatic light or mixed light.

The image capture device 60 may collect light reflected from the surface of the wafer chuck 20 after being output from the light source 50. For example, the image capture device 60 may include a CCD camera imaging the surface of the wafer chuck 20. The CCD camera may be a black and white CCD camera, but the present inventive subject matter is not limited thereto.

The processor or calculating unit 80 may determine cutting lines on the wafer 30 on the basis of the image obtained by the image capture device 60. The calculating unit 80 may be, for example, programmed to convert the image captured by the image capture device 60 into a grayscale image, and may include a memory storing a pre-set electrode pattern image. Also, the calculating unit 80 may be programmed to compare the converted grayscale image with the pre-set electrode pattern image to identify or determine regions of the wafer 30 according to the comparison results.

In the present embodiment, the converted grayscale image may include a region of the semiconductor device 40 in which the electrode pattern is exposed and a region in which the semiconductor layer is exposed (and/or in which no electrode pattern is exposed), and here, the region in which the semiconductor layer is exposed may have a brightness value equal to or greater than 150. However, the present inventive subject matter is not limited thereto.

Also, the processor or calculating unit 80 may have a program installed to divide the determined cutting lines into at least two or more groups in order to perform the operations described above with reference to FIGS. 16 and 17A through 17C.

The cutting assembly 70 may sever the wafer 30 along the cutting lines determined by the calculating unit 80. The cutting assembly 70 may include a laser light source 71 irradiating a laser to the wafer 30 and a breaker 72 pressurizing the cutting lines of the wafer 30 in which cracks have been generated due to the irradiation of the laser. However, the present inventive subject matter is not limited thereto.

According to the present embodiment, the apparatus for manufacturing a semiconductor device capable of precisely cutting the wafer 30 with the semiconductor devices 40 formed thereon can be obtained.

Figure 19:
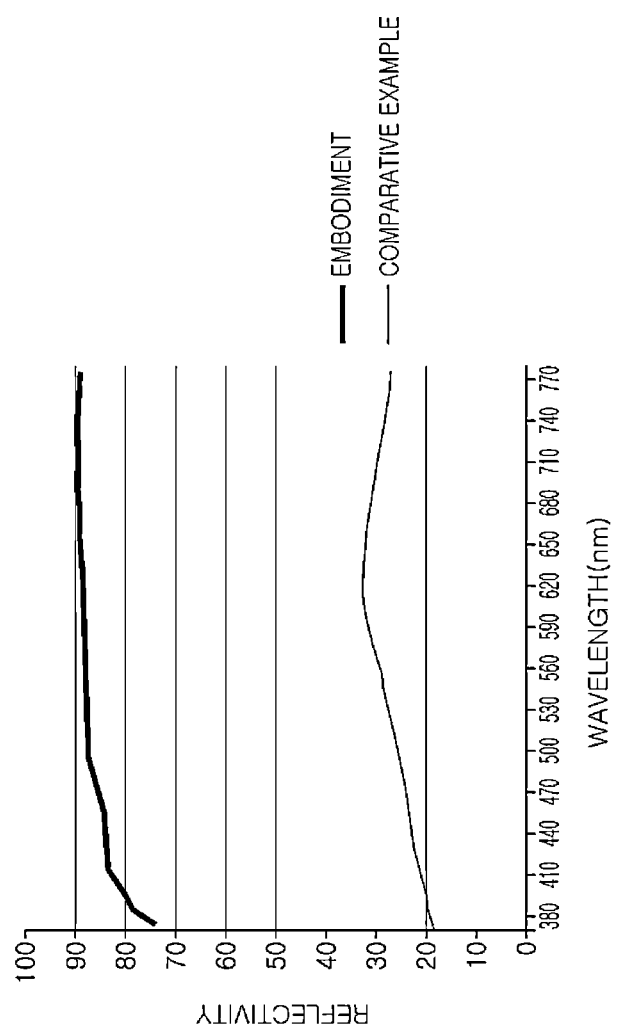
FIGS. 19, 20A, 20B, 21A, and 21B are graphs and photographs showing comparison between performances of an embodiment of the method for manufacturing a semiconductor device according to the present inventive concepts and a comparative example.

FIGS. 19 through 21 are graphs and photographs showing comparison between an embodiment of the method for manufacturing a semiconductor device of the present inventive subject matter and a comparative example.

FIG. 19 is a graph showing a comparison between reflectivity of the wafer chuck 20 prepared according to the present embodiment and that of the related art wafer chuck.

Referring to FIG. 19, as the wafer chuck according to the present embodiment, a ceramic chuck containing aluminum oxide ($Al_2O_3$) having purity of 95% was used, and here, the ceramic chuck exhibited a whiteness index of 95.08 and reflectivity equal to or greater than 74.56% with respect to each light having a wavelength ranging from 380 nm to 780 nm. In detail, the surface of the wafer chuck according to the present embodiment exhibited reflectivity ranging from 74.56% to 89.59% with respect to light having a wavelength ranging from 380 nm to 780 nm, and measured to have reflectivity of 89.907% on average.

In comparison, the wafer chuck of the comparative example was a generally used ceramic chuck containing aluminum oxide ($Al_2O_3$) having purity ranging from 80% to 90% and a surface thereof was measured to have a whiteness index of 60.55. Also, the wafer chuck according to the comparative example had reflectivity ranging from 18.9% to 32.54% with respect to light having a wavelength ranging from 380 nm to 780 nm and was measured to have reflectivity of 27.367% on average.

Figure 20A:
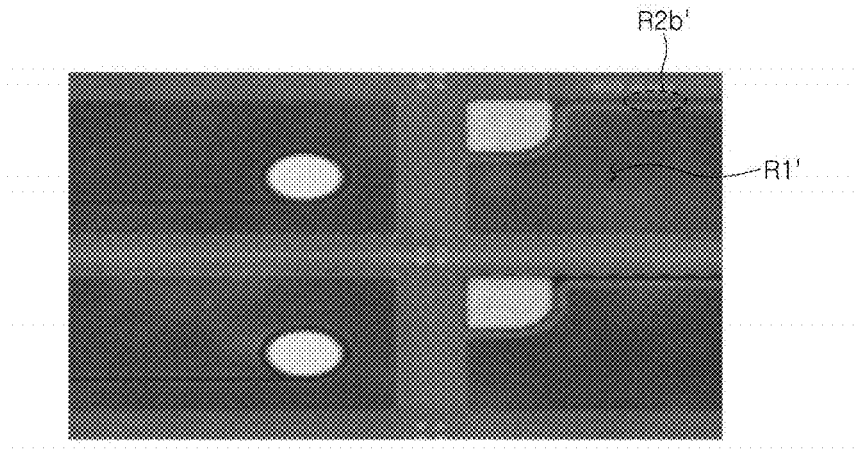
Figure 20B:
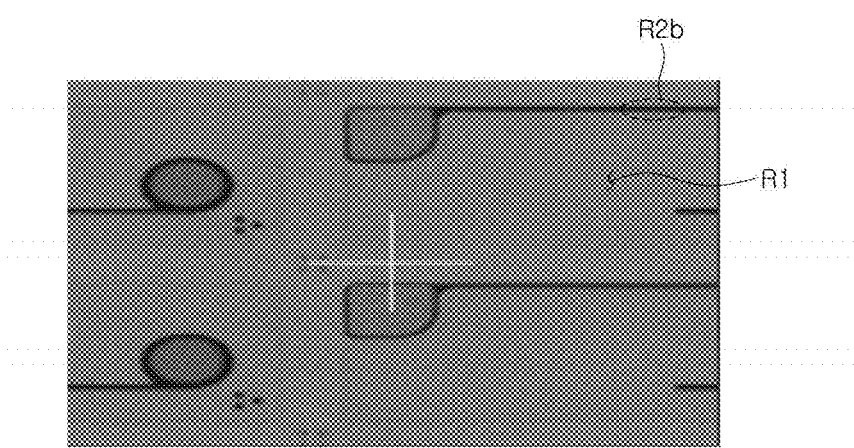

FIGS. 20A and 20B are photographs showing images of wafer chucks in which the operation S41 of converting images obtained through imaging into grayscale images is completed.

In detail, FIGS. 20A and 20B respectively show a grayscale image according to the comparative example, and a grayscale image according to the present embodiment.

Referring to FIG. 20A, in the case of the grayscale image according to the comparative example, it can be seen that a region in which the electrode pattern is exposed and the region in which the semiconductor layer is exposed are not clearly discriminated (or discernible). In detail, in the case of the comparative example, a brightness value of a region R1' in which the semiconductor layer is exposed is 89, and that of a region R2b' in which the electrode finger is formed is measured to be 90. The small difference in brightness values may degrade a recognition rate of the electrode pattern and cause an error in determining cutting lines on the wafer.

Meanwhile, referring to FIG. 20B, in the case of the grayscale image according to the present embodiment, it can be seen that the region in which the electrode pattern is exposed and the region in which the semiconductor layer is exposed are clearly discriminated. In particular, a brightness value of the region R1 in which the semiconductor layer is exposed is measured to be 211, and that of the region R2b in which the electrode finger is formed is measured to be 128. In the present embodiment, a difference between the brightness values of the region R1 in which the semiconductor layer is exposed and the region R2b in which the electrode finger is formed is 83, and it can be seen that the region R2b in which the electrode finger is formed can be clearly discriminated, unlike in the comparative example. Namely, according to the present embodiment, a recognition rate of the electrode pattern can be significantly increased, and cutting lines of the wafer can be determined without error.

Figure 21A:
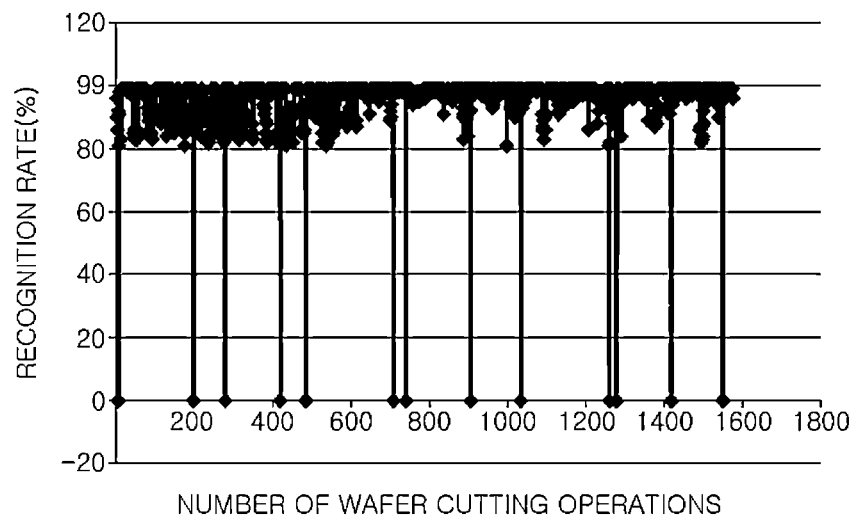
Figure 21B:
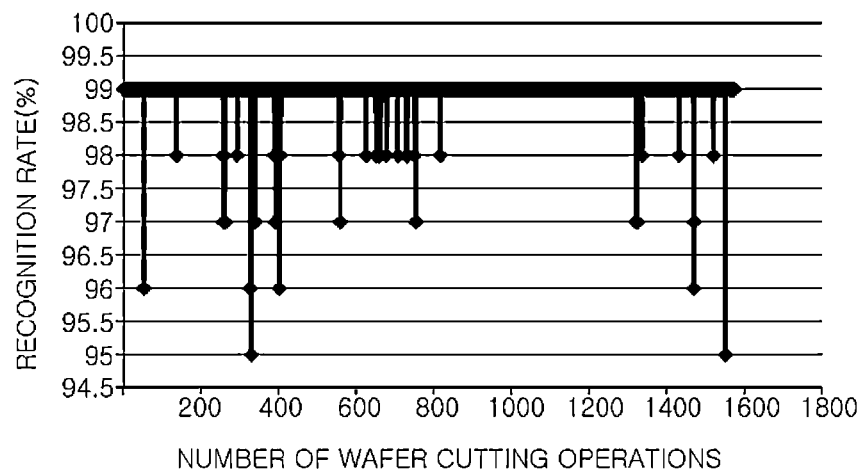

FIGS. 21A and 21B are graphs showing a comparison between the recognition performance of the present embodiment and that of the comparative example.

In this experiment, a wafer cutting operation was performed 1575 times. Here, FIG. 21A is a graph showing a recognition rate of the electrode pattern measured by using the wafer chuck according to the comparative example, and FIG. 21B is a graph showing a recognition rate of the electrode pattern measured by using the wafer chuck according to the present embodiment.

Here, the recognition rate was obtained by comparing respective pixel brightness values of an image of the pre-set electrode pattern and a converted grayscale image and calculating the percentage of pixels having the same brightness value. The recognition rate may be used as a criterion (or scale) for evaluating whether the converted grayscale image is effectively matched to the pre-set electrode pattern image.

Referring to FIGS. 21A and 21B, it can be seen that the recognition rate of the electrode pattern according to the present embodiment was 98.959% on average, higher than the recognition rate, i.e., 95.174%, of the comparative example, and the number of errors measured to have a recognition rate of 0% was significantly reduced.

As set forth above, according to an embodiment of the present inventive subject matter, the method for manufacturing a semiconductor device having enhanced precision in cutting a wafer with semiconductor devices formed thereon can be obtained.

According to an embodiment of the inventive subject matter, the apparatus for manufacturing a semiconductor device capable of precisely cutting the wafer with semiconductor devices formed thereon can be obtained.

While the present inventive subject matter has been shown and described in connection with illustrative embodiments, it will be apparent to those skilled in the art that modifications and variations can be made without departing from the spirit and scope of the inventive subject matter as defined by the appended claims.

What is claimed is:

1. An apparatus for cutting a wafer comprising:
    a wafer chuck configured to hold the wafer on a surface thereof, wherein the surface of the wafer chuck on which the wafer is held has a reflectivity equal to or greater than 40%;
    a light source configured to illuminate the surface of the wafer chuck through the wafer;
    an image capture device configured to form an image of the wafer based on light emitted by the light source and reflected by the surface of the wafer chuck;
    a processor configured to determine locations of cutting lines on the wafer based on the formed image; and
    a cutting assembly configured to cut the wafer along the cutting lines determined by the processor;
    wherein electrode patterns of a plurality of semiconductor devices disposed on a surface of the wafer impede passage of the reflected light through the wafer, and the image capture device forms the image of the wafer showing first regions of the wafer in which light emitted by the light source is reflected by the surface of the wafer chuck to the image capture device, and second regions of the wafer having electrode patterns therein in which light emitted by the light source is not reflected by the surface of the wafer chuck to the image capture device.

2. The apparatus of claim 1, wherein the surface of the wafer chuck on which the wafer is held has a whiteness index value equal to or greater than 90.

3. The apparatus of claim 2, wherein the wafer chuck is made of a ceramic containing aluminum oxide having a purity equal to or greater than 95%.

4. The apparatus of claim 1, wherein the wafer is a transparent wafer.

5. The apparatus of claim 1, wherein the wafer chuck is a porous ceramic, and the wafer is held to the surface of the porous wafer chuck using vacuum adsorption through pores of the ceramic wafer chuck.

6. The apparatus of claim 1, further comprising an adhesive layer disposed on the surface of the wafer chuck to hold the wafer on the surface of the wafer chuck and formed of a transparent material.

7. The apparatus of claim 1, wherein electrode patterns of a plurality of semiconductor devices disposed on a surface of the wafer impede passage of the reflected light through the wafer, and the image capture device forms the image of the wafer showing first regions of the wafer in which light emitted by the light source is reflected by the surface of the wafer chuck to the image capture device, and second regions of the wafer having electrode patterns therein in which fight emitted by the light source is not reflected by the surface of the wafer chuck to the image capture device.

8. The apparatus of claim 1, wherein the processor determines locations of cutting lines on the wafer by performing steps of:
    identifying at least one location in the formed image matching a pre-set image of an electrode pattern of a plurality of electrode patterns disposed on the wafer; and determining locations of the cutting lines on the wafer based on the identified at least one location and on a location of a cutting line in the matched pre-set image of the electrode pattern.

9. The apparatus of claim 1, wherein the processor is configured to determine locations of a first set of cutting lines on the wafer based on the formed image prior to cutting of the wafer by the cutting assembly, and is further configured to determine locations of a second set of cutting lines on the wafer based on another formed image of the wafer following the cutting of the wafer along the first set of cutting lines.

10. An apparatus for cutting a wafer comprising:
a wafer chuck configured to hold the wafer on a surface thereof, wherein the surface of the wafer chuck on which the wafer is held has a whiteness index value equal to or greater than 90;
a light source configured to illuminate the surface of the wafer chuck through the wafer;
an image capture device configured to form an image of the wafer cased on light emitted by the light source that is passed through the wafer and reflected by a portion of the surface of the wafer chuck that is covered by the wafer;
a processor configured to determine locations of cutting lines on the wafer based on the formed image; and
a cutting assembly configured to cut the wafer along the cutting lines determined by the processor;
wherein electrode patterns of a plurality of semiconductor devices disposed on a surface of the wafer impede passage of the reflected light through the wafer, and the image capture device forms the image of the wafer showing first regions of the wafer in which light emitted by the light source is reflected by the surface of the wafer chuck to the image capture device, and second regions of the wafer having electrode patterns therein in which light emitted by the light source is not reflected by the surface of the wafer chuck to the image capture device.

11. The apparatus of claim 10, wherein the wafer chuck is made of a ceramic containing aluminum oxide having a purity equal to or greater than 95%.

12. The apparatus of claim 11, wherein the surface of the wafer chuck on which the wafer is held has a reflectivity equal to or greater than 40%.

13. The apparatus of claim 10, wherein electrode patterns of a plurality of semiconductor devices disposed on a surface of the wafer impede passage of the reflected light through the wafer, and the image capture device forms the image of the wafer showing first regions of the wafer in which light emitted by the light source is reflected by the surface of the wafer chuck to the image capture device, and second regions of the wafer having electrode patterns therein in which light emitted by the light source is not reflected by the surface of the wafer chuck to the image capture device.

14. The apparatus of claim 10, wherein the processor determines locations of cutting lines on the wafer by performing steps of:
identifying at least one location in the formed image matching a pre-set image of an electrode pattern of a plurality of electrode patterns disposed on the wafer; and
determining locations of the cutting lines on the wafer based on the identified at least one location and on a location of a cutting line in the matched pre-set image of the electrode pattern.

15. The apparatus of claim 10, wherein the processor is configured to determine locations of a first set of cutting lines on the wafer based on the formed image prior to cutting of the wafer by the cutting assembly, and is further configured to determine locations of a second set of cutting lines on the wafer based on another formed image of the wafer following the cutting of the wafer along the first set of cutting lines.

16. An apparatus for cutting a wafer comprising:
a wafer chuck configured to hold the wafer on a surface thereof, wherein the wafer chuck is made of a ceramic containing aluminum oxide having a purity equal to or greater than 95%;
a light source configured to illuminate the surface of the wafer chuck through the wafer;
an image capture device configured to form an image of the wafer based on light emitted by the light source and reflected by the surface of the wafer chuck;
a processor configured to determine locations of cutting lines on the wafer based on the formed image; and
a cutting assembly configured to cut the wafer along the cutting lines determined by the processor,
wherein electrode patterns of a plurality of semiconductor devices disposed on a surface of the wafer impede passage of the reflected light through the wafer, and the image capture device forms the image of the wafer showing first regions of the wafer in which light emitted by the light source is reflected by the surface of the wafer chuck to the image capture device, and second regions of the wafer having electrode patterns therein in which light emitted by the light source is not reflected by the surface of the wafer chuck to the image capture device.

17. The apparatus of claim 16, wherein the surface of the wafer chuck on which the wafer is held has a reflectivity equal to or greater than 40%.

18. The apparatus of claim 17, wherein the surface of the wafer chuck on which the wafer is held has a whiteness index value equal to or greater than 90.

19. The apparatus of claim 16, wherein the processor determines locations of cutting lines on the wafer by performing steps of:
identifying at least one location in the formed image matching a pre-set image of an electrode pattern of a plurality of electrode patterns disposed on the wafer; and
determining locations of the cutting lines on the wafer based on the identified at least one location and on a location of a cutting line in the matched pre-set image of the electrode pattern.

20. The apparatus of claim 16, wherein the processor is configured to determine locations of a first set of cutting lines on the wafer based on the formed image prior to cutting of the wafer by the cutting assembly, and is further configured to determine locations of a second set of cutting lines on the wafer based on another formed image of the wafer following the cutting of the wafer along the first set of cutting lines.

* * * * *